(12) United States Patent
Huang et al.

(10) Patent No.: US 9,490,808 B2
(45) Date of Patent: Nov. 8, 2016

(54) SENSING CIRCUIT

(71) Applicant: MediaTek Inc., Hsin-Chu (TW)

(72) Inventors: Bo-Jr Huang, Hsinchu (TW); Jia-Wei Fang, Hsinchu (TW)

(73) Assignee: MEDIATEK INC., Hsin-Chu (TW)

(*) Notice: Subject to any disclaimer, the term of this patent is extended or adjusted under 35 U.S.C. 154(b) by 0 days.

(21) Appl. No.: 14/926,775

(22) Filed: Oct. 29, 2015

(65) Prior Publication Data

US 2016/0156354 A1 Jun. 2, 2016

Related U.S. Application Data

(60) Provisional application No. 62/085,805, filed on Dec. 1, 2014.

(51) Int. Cl.
*H03K 17/296* (2006.01)
*H03K 19/003* (2006.01)
*H03K 5/14* (2014.01)
*G06F 1/24* (2006.01)
*H03K 17/22* (2006.01)
*H03K 19/20* (2006.01)

(52) U.S. Cl.
CPC ............ *H03K 19/00361* (2013.01); *G06F 1/24* (2013.01); *H03K 5/14* (2013.01); *H03K 17/223* (2013.01); *H03K 19/20* (2013.01)

(58) Field of Classification Search
CPC .................................................. H03K 19/00361
See application file for complete search history.

(56) References Cited

U.S. PATENT DOCUMENTS 6,268,753 B1 * 7/2001 Sandusky .............. H03K 5/133
327/266

* cited by examiner

*Primary Examiner* — Daniel Puentes
(74) *Attorney, Agent, or Firm* — McClure, Qualey & Rodack, LLP

(57) ABSTRACT

A sensing circuit includes a delay chain and a decoder. The delay chain includes at least one delay unit, at least one cascading switch, and at least one feedback switch. The delay unit generates a delay signal according to an input signal and a reset signal. The cascading switch selectively passes the delay signal according to a control signal. The feedback switch selectively forms a feedback path of the delay unit according to the control signal. The decoder generates an output signal according to the delay signal. The delay unit is supplied by a work voltage. If the work voltage has noise, the noise will be detectable by analyzing the output signal of the decoder.

20 Claims, 6 Drawing Sheets

SENSING CIRCUIT

CROSS REFERENCE TO RELATED APPLICATIONS

This application claims the benefit of U.S. Provisional Application No. 62/085,805, filed on 2014 Dec. 1, the entirety of which is incorporated by reference herein.

BACKGROUND OF THE INVENTION

1. Field of the Invention

The disclosure generally relates to a sensing circuit, and more particularly, to a sensing circuit for detecting supply voltage noise.

2. Description of the Related Art

A circuit should be coupled to a supply voltage and obtain electric power therefrom. Ideally, the supply voltage is a fixed value. In fact, since the supply voltage is coupled through a power mesh to the circuit and the power mesh has a resistance, an IR drop will occur and the effective supply voltage changes. The so-called IR drop is a voltage drop which results from currents flowing through the power mesh with a resistance, and it leads to a fluctuation of the supply voltage, degrading the performance of the circuit. Accordingly, there is a need to design a novel circuit to overcome the drawbacks of the prior art.

BRIEF SUMMARY OF THE INVENTION

In a preferred embodiment, the disclosure is directed to a sensing circuit including a delay chain and a decoder. The delay chain includes a first delay unit, a first cascading switch, and a first feedback switch. The first delay unit generates a first delay signal according to an input signal and a reset signal. The first cascading switch selectively passes the first delay signal according to a control signal. The first feedback switch selectively forms a feedback path of the first delay unit according to the control signal. The decoder generates an output signal according to the first delay signal.

In some embodiments, in a calculating mode, the first cascading switch is closed and the first feedback switch is opened, such that the input signal progresses in the delay chain, and in a reading mode, the first cascading switch is opened and the first feedback switch is closed, such that the first delay unit forms a latch and the decoder reads the first delay signal from the delay chain.

In some embodiments, the first delay unit has a first input terminal for receiving the input signal, a second input terminal for receiving the reset signal, and an output terminal for outputting the first delay signal.

In some embodiments, the first cascading switch has a first terminal coupled to the output terminal of the first delay unit, and a second terminal for selectively outputting the first delay signal.

In some embodiments, the first feedback switch has a first terminal coupled to the output terminal of the first delay unit, and a second terminal coupled to the first input terminal of the first delay unit.

In some embodiments, the first delay unit is implemented with an AND gate.

In some embodiments, in an initial mode, the reset signal has a low logic level, and the first delay signal is kept at a low logic level, and in other modes, the reset signal has a high logic level, and the first delay signal is adjustable.

In some embodiments, when the sensing circuit enters the calculating mode, both the input signal and the control signal rise from a low logic level to a high logic level, and when the sensing circuit enters the reading mode, the control signal falls from the high logic level to the low logic level.

In some embodiments, the first cascading switch and the first feedback switch are complementary to each other and are implemented with transmission gates, and each of the transmission gates includes a PMOS transistor (P-type Metal Oxide Semiconductor Field Effect Transistor) and an NMOS transistor (N-type Metal Oxide Semiconductor Field Effect Transistor) coupled in parallel.

In some embodiments, the delay chain further includes a second delay unit, a second cascading switch, and a second feedback switch. The second delay unit generates a second delay signal according to the first delay signal and the reset signal. The second cascading switch selectively passes the second delay signal according to the control signal. The second feedback switch selectively forms a feedback path of the second delay unit according to the control signal. The output signal is generated by the decoder further according to the second delay signal.

In some embodiments, in a calculating mode, the second cascading switch is closed and the second feedback switch is opened, such that the first delay signal progresses in the delay chain, and in a reading mode, the second cascading switch is opened and the second feedback switch is closed, such that the second delay unit forms a latch and the decoder reads the second delay signal from the delay chain.

In some embodiments, the second delay unit has a first input terminal for receiving the first delay signal, a second input terminal for receiving the reset signal, and an output terminal for outputting the second delay signal.

In some embodiments, the second cascading switch has a first terminal coupled to the output terminal of the second delay unit, and a second terminal for selectively outputting the second delay signal.

In some embodiments, the second feedback switch has a first terminal coupled to the output terminal of the second delay unit, and a second terminal coupled to the first input terminal of the second delay unit.

In some embodiments, the second delay unit is implemented with an AND gate.

In some embodiments, the second cascading switch and the second feedback switch are complementary to each other.

In some embodiments, the delay chain further includes a third delay unit, a third cascading switch, a third feedback switch, a fourth delay unit, a fourth cascading switch, and a fourth feedback switch. The third delay unit generates a third delay signal according to the second delay signal and the reset signal. The third cascading switch selectively passes the third delay signal according to the control signal. The third feedback switch selectively forms a feedback path of the third delay unit according to the control signal. The fourth delay unit generates a fourth delay signal according to the third delay signal and the reset signal. The fourth cascading switch selectively passes the fourth delay signal according to the control signal. The fourth feedback switch selectively forms a feedback path of the fourth delay unit according to the control signal. The output signal is generated by the decoder further according to the third delay signal and the fourth delay signal.

In some embodiments, the first delay unit, the second delay unit, the third delay unit, and the fourth delay unit are supplied by a work voltage, and if the work voltage has noise, the noise is detectable by analyzing the output signal of the decoder.

In some embodiments, if the output signal shows that the input signal is transmitted through more of the first delay unit, the second delay unit, the third delay unit, and the fourth delay unit, it represents that the noise of the work voltage is less serious.

In some embodiments, the decoder is arranged for converting $2^N$ bits into N bits, and N is a positive integer.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are disclosed in detail as follows.

Figure 1:
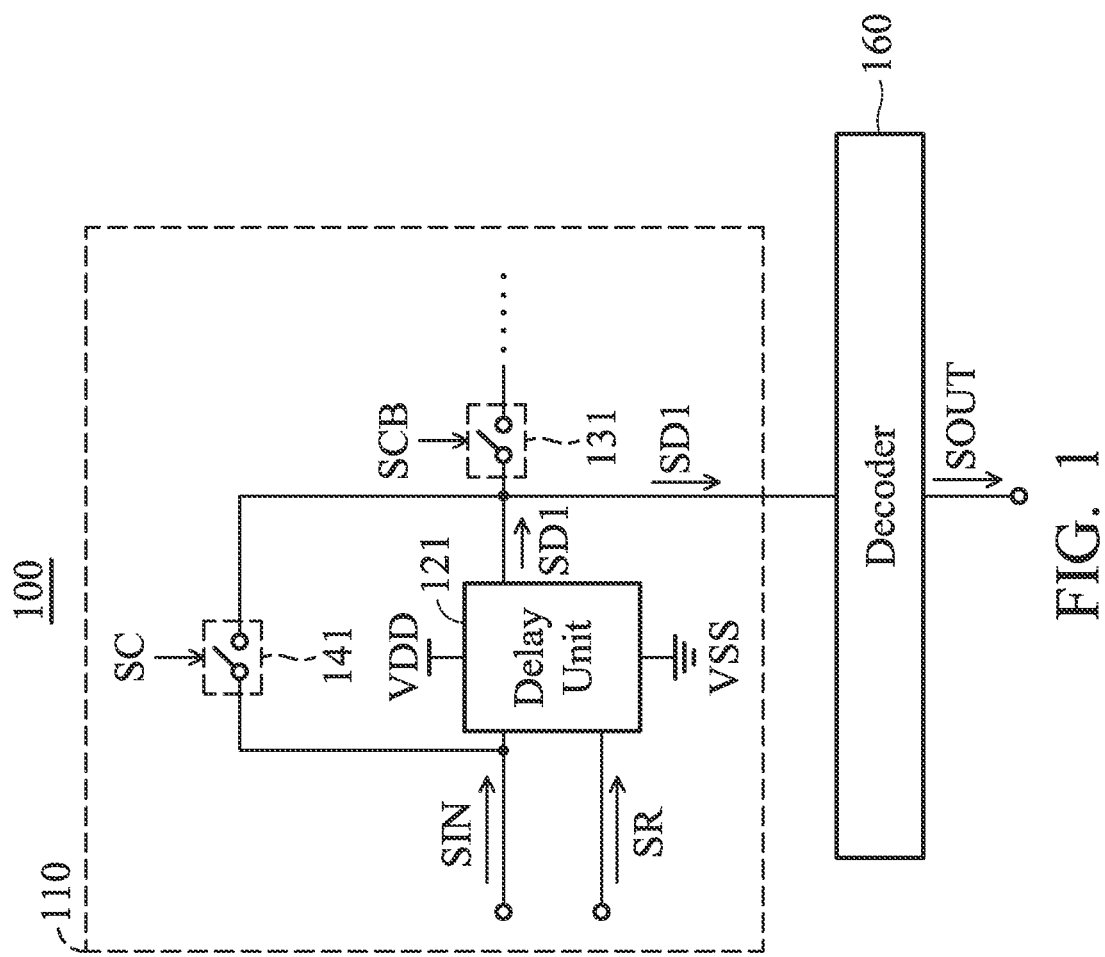
FIG. 1 is a diagram of a sensing circuit according to an embodiment of the invention.

FIG. 1 is a diagram of a sensing circuit 100 according to an embodiment of the invention. The sensing circuit 100 is configured to detect supply voltage noise of a variety of circuits. In the embodiment of FIG. 1, the sensing circuit 100 includes a delay chain 110 and a decoder 160. The delay chain 110 at least includes a first delay unit 121, a first cascading switch 131, and a first feedback switch 141. The first delay unit 121 is supplied by a work voltage VDD (i.e., a supply voltage) and a ground voltage VSS. The first delay unit 121 generates a first delay signal SD1 according to an input signal SIN and a reset signal SR. The first cascading switch 131 selectively passes the first delay signal SD1 according to an inverted control signal SCB. The first feedback switch 141 selectively forms a feedback path of the first delay unit 121 according to a control signal SC. The logic level of the control signal SC is complementary to that of the inverted control signal SCB, and therefore the first cascading switch 131 and the first feedback switch 141 are complementary to each other. The decoder 160 generates an output signal SOUT according to the first delay signal SD1.

The first delay unit 121 has a first input terminal for receiving the input signal SIN, a second input terminal for receiving the reset signal SR, and an output terminal for outputting the first delay signal SD1. The first cascading switch 131 has a first terminal coupled to the output terminal of the first delay unit 121, and a second terminal for selectively outputting the first delay signal SD1. The first feedback switch 141 has a first terminal coupled to the output terminal of the first delay unit 121, and a second terminal coupled to the first input terminal of the first delay unit 121.

The sensing circuit 100 can operate in a calculating mode and a reading mode. In the calculating mode, the first cascading switch 131 is closed and the first feedback switch 141 is opened, such that the input signal SIN progresses in the delay chain 110. In the reading mode, the first cascading switch 131 is opened and the first feedback switch 141 is closed, such that the first delay unit 121 forms a latch and the decoder 160 reads the first delay signal SD1 from the delay chain 110. The noise of the work voltage VDD can be detected by analyzing the output signal SOUT of the decoder 160. The detailed operation and theory of the sensing circuit 100 will be described in the following embodiments. It should be understood that these embodiments and figures are just exemplary, rather than limitations of the invention.

Figure 2:
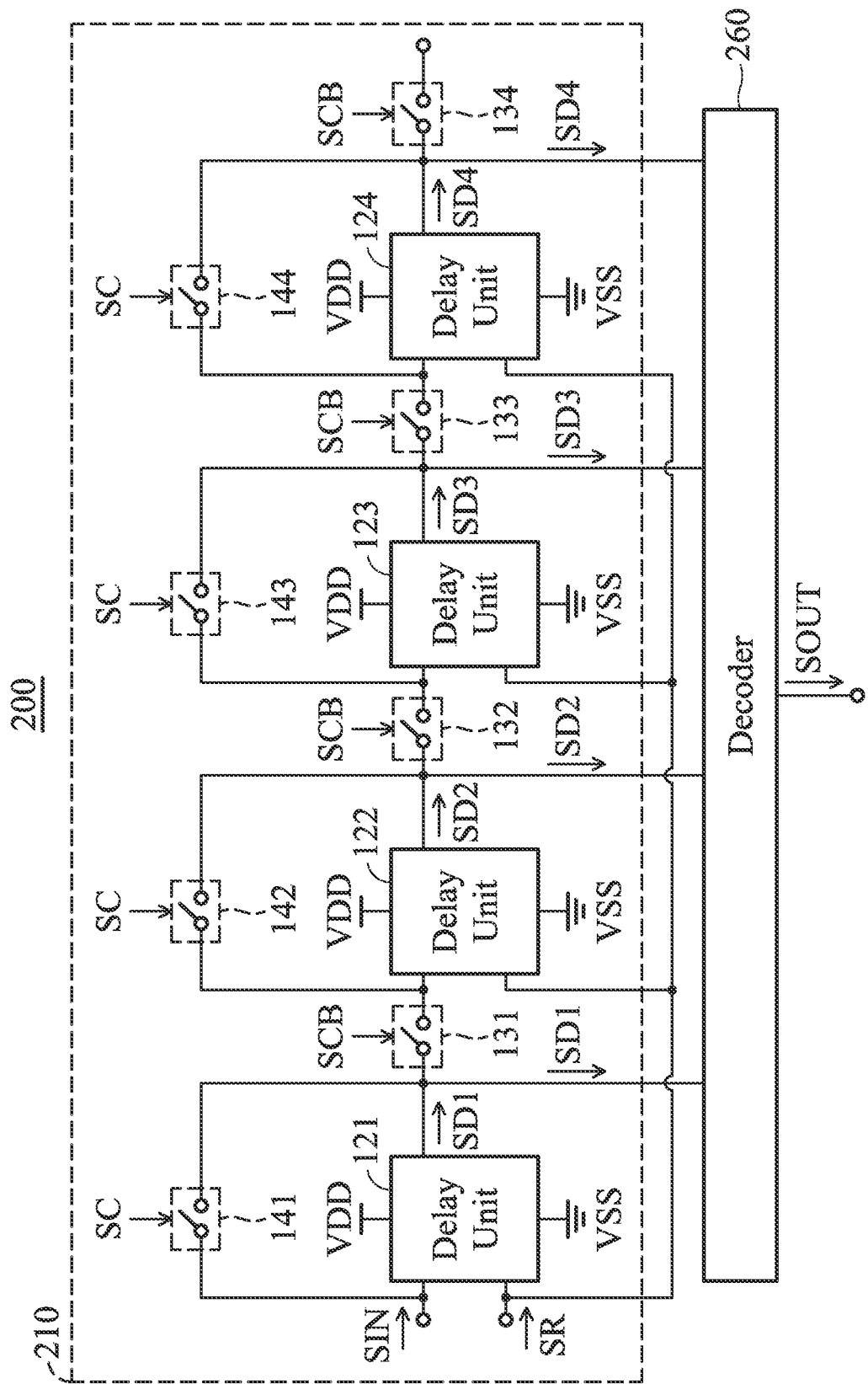
FIG. 2 is a diagram of a sensing circuit according to an embodiment of the invention.

FIG. 2 is a diagram of a sensing circuit 200 according to an embodiment of the invention. FIG. 2 is similar to FIG. 1. The sensing circuit 200 includes a delay chain 210 and a decoder 260. The difference between the two embodiments is that the delay chain 210 of the sensing circuit 200 includes more delay units and more switches. For example, the delay chain 210 may include a first delay unit 121, a first cascading switch 131, a first feedback switch 141, a second delay unit 122, a second cascading switch 132, a second feedback switch 142, a third delay unit 123, a third cascading switch 133, a third feedback switch 143, a fourth delay unit 124, a fourth cascading switch 134, and a fourth feedback switch 144. It should be understood that the number of delay units and the number of switches are adjustable in the invention. The sensing circuit 200 may include more or less delay units and switches in alternative embodiments.

The first delay unit 121 generates a first delay signal SD1 according to an input signal SIN and a reset signal SR. The first cascading switch 131 selectively passes the first delay signal SD1 to the second delay unit 122 according to an inverted control signal SCB. The first feedback switch 141 selectively forms a feedback path of the first delay unit 121 according to a control signal SC. The second delay unit 122 generates a second delay signal SD2 according to the first delay unit SD1 and the reset signal SR. The second cascading switch 132 selectively passes the second delay signal SD2 to the third delay unit 123 according to the inverted control signal SCB. The second feedback switch 142 selectively forms a feedback path of the second delay unit 122 according to the control signal SC. The third delay unit 123 generates a third delay signal SD3 according to the second delay unit SD2 and the reset signal SR. The third cascading switch 133 selectively passes the third delay signal SD3 to the fourth delay unit 124 according to the inverted control signal SCB. The third feedback switch 143 selectively forms a feedback path of the third delay unit 123 according to the control signal SC. The fourth delay unit 124 generates a fourth delay signal SD4 according to the third delay unit SD3 and the reset signal SR. The fourth cascading switch 134 selectively passes the fourth delay signal SD4 according to the inverted control signal SCB. The fourth feedback switch 144 selectively forms a feedback path of the fourth delay unit 124 according to the control signal SC. The decoder 260 generates an output signal SOUT according to the first delay signal SD1, the second delay signal SD2, the third delay signal SD3, and the fourth delay signal SD4.

The first delay unit 121 has a first input terminal for receiving the input signal SIN, a second input terminal for receiving the reset signal SR, and an output terminal for outputting the first delay signal SD1. The first cascading switch 131 has a first terminal coupled to the output terminal of the first delay unit 121, and a second terminal for selectively outputting the first delay signal SD1 to the second delay unit 122. The first feedback switch 141 has a first terminal coupled to the output terminal of the first delay unit 121, and a second terminal coupled to the first input terminal of the first delay unit 121. The second delay unit 122 has a first input terminal for receiving the first delay signal SD1, a second input terminal for receiving the reset signal SR, and an output terminal for outputting the second delay signal SD2. The second cascading switch 132 has a first terminal coupled to the output terminal of the second delay unit 122, and a second terminal for selectively outputting the second delay signal SD2 to the third delay unit 123. The second feedback switch 142 has a first terminal coupled to the output terminal of the second delay unit 122, and a second terminal coupled to the first input terminal of the second delay unit 122. The third delay unit 123 has a first input terminal for receiving the second delay signal SD2, a second input terminal for receiving the reset signal SR, and an output terminal for outputting the third delay signal SD3. The third cascading switch 133 has a first terminal coupled to the output terminal of the third delay unit 123, and a second terminal for selectively outputting the third delay signal SD3 to the fourth delay unit 124. The third feedback switch 143 has a first terminal coupled to the output terminal of the third delay unit 123, and a second terminal coupled to the first input terminal of the third delay unit 123. The fourth delay unit 124 has a first input terminal for receiving the third delay signal SD3, a second input terminal for receiving the reset signal SR, and an output terminal for outputting the fourth delay signal SD4. The fourth cascading switch 134 has a first terminal coupled to the output terminal of the fourth delay unit 124, and a second terminal for selectively outputting the fourth delay signal SD4. The fourth feedback switch 144 has a first terminal coupled to the output terminal of the fourth delay unit 124, and a second terminal coupled to the first input terminal of the fourth delay unit 124.

The sensing circuit 200 can operate in a calculating mode and a reading mode. In the calculating mode, the first cascading switch 131, the second cascading switch 132, the third cascading switch 133, and the fourth cascading switch 134 are closed, and the first feedback switch 141, the second feedback switch 142, the third feedback switch 143, and the fourth feedback switch 144 are opened, such that the input signal SIN, the first delay signal SD1, the second delay signal SD2, the third delay signal SD3, and the fourth delay signal SD4 progress in the delay chain 210. In the reading mode, the first cascading switch 131, the second cascading switch 132, the third cascading switch 133, and the fourth cascading switch 134 are opened, and the first feedback switch 141, the second feedback switch 142, the third feedback switch 143, and the fourth feedback switch 144 are closed, such that the first delay unit 121, the second delay unit 122, the third delay unit 123, and the fourth delay unit 124 each forms a respective latch, and the decoder 260 reads the first delay signal SD1, the second delay signal SD2, the third delay signal SD3, and the fourth delay signal SD4 from the delay chain 210. Similarly, the first delay unit 121, the second delay unit 122, the third delay unit 123, and the fourth delay unit 124 are supplied by a work voltage VDD (i.e., a supply voltage) and a ground voltage VSS. If the work voltage VDD has any noise, the noise is detectable by analyzing the output signal SOUT of the decoder 260. In comparison to the sensing circuit 100 of FIG. 1, the sensing circuit 200 includes more delay units and switches, and provides higher accuracy of voltage noise detection.

Figure 3:
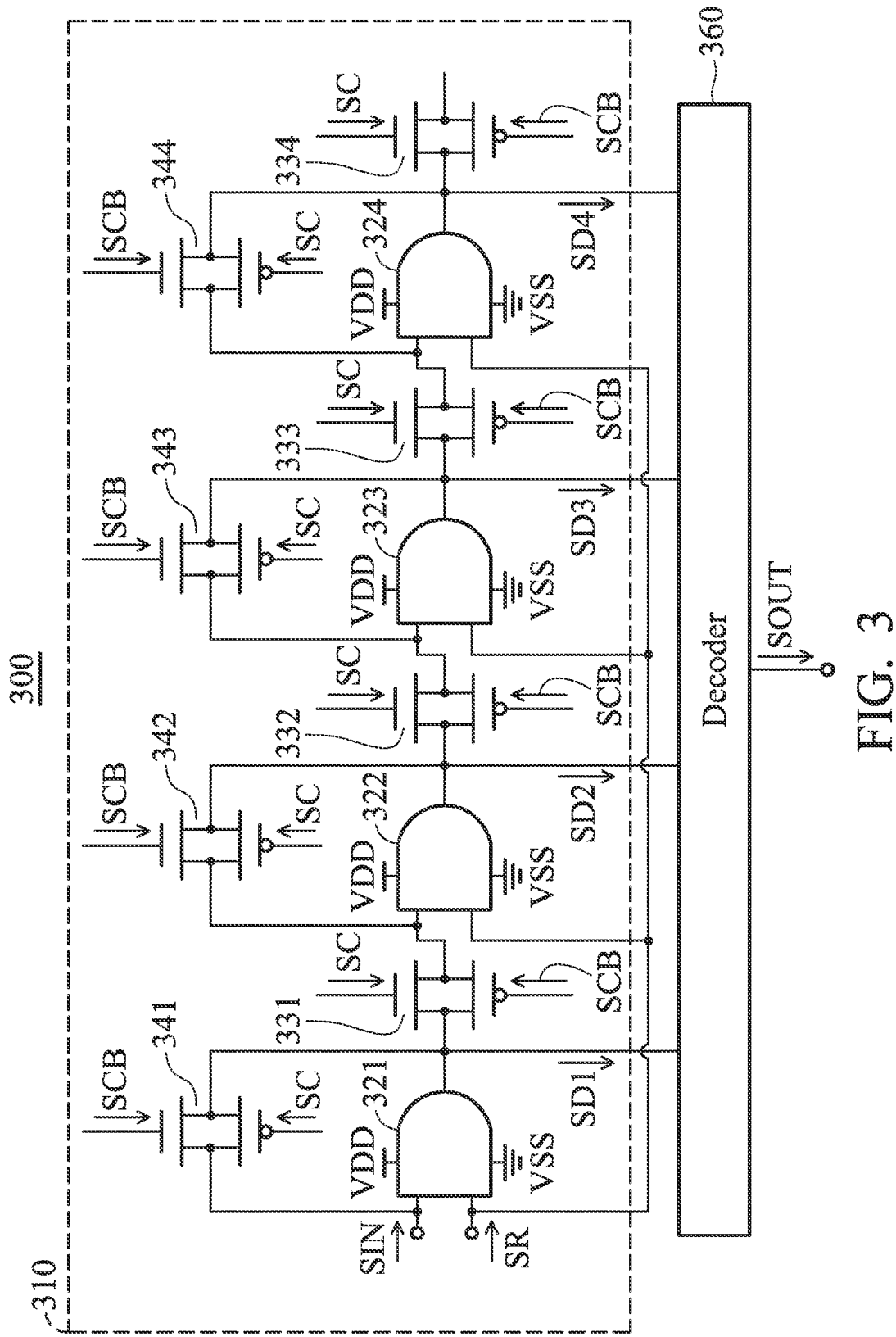
FIG. 3 is a diagram of a sensing circuit according to an embodiment of the invention.

FIG. 3 is a diagram of a sensing circuit 300 according to an embodiment of the invention. FIG. 3 is similar to FIG. 2. The sensing circuit 300 includes a delay chain 310 and a decoder 360. The difference between the two embodiments is that in the delay chain 310 of the sensing circuit 300, a first delay unit 321, a second delay unit 322, a third delay unit 323, and a fourth delay unit 324 are implemented with AND gates, and furthermore, a first cascading switch 331, a first feedback switch 341, a second cascading switch 332, a second feedback switch 342, a third cascading switch 333, a third feedback switch 343, a fourth cascading switch 334, and a fourth feedback switch 344 are implemented with transmission gates. Each of the transmission gates includes a PMOS transistor (P-type Metal Oxide Semiconductor Field Effect Transistor) and an NMOS transistor (N-type Metal Oxide Semiconductor Field Effect Transistor) coupled in parallel. Each of the cascading switches is complementary to its corresponding feedback switch. It should be understood that the invention is not limited to the above. In alternative embodiments, the above delay units may be implemented with NAND gates, OR gates, NOR gates, or inverters, and the above cascading switches and feedback switches may be implemented with NMOS transistors or PMOS transistors.

The operation of the sensing circuit 300 is similar to that of the above sensing circuits 100 and 200. The sensing circuit 300 can operate in an initial mode, a calculating mode, and a reading mode. In the initial mode, the reset signal SR has a low logic level (e.g., a logic "0"), such that the first delay signal SD1, the second delay signal SD2, the third delay signal SD3, and the fourth delay signal SD4 are reset and kept at a low logic level. In the other modes, the reset signal SR has a high logic level (e.g., a logic "1"), such that the first delay signal SD1, the second delay signal SD2, the third delay signal SD3, and the fourth delay signal SD4 are adjustable. The calculating mode and the reading mode of the sensing circuit 300 will be illustrated in the following embodiments and figures.

Figure 4:
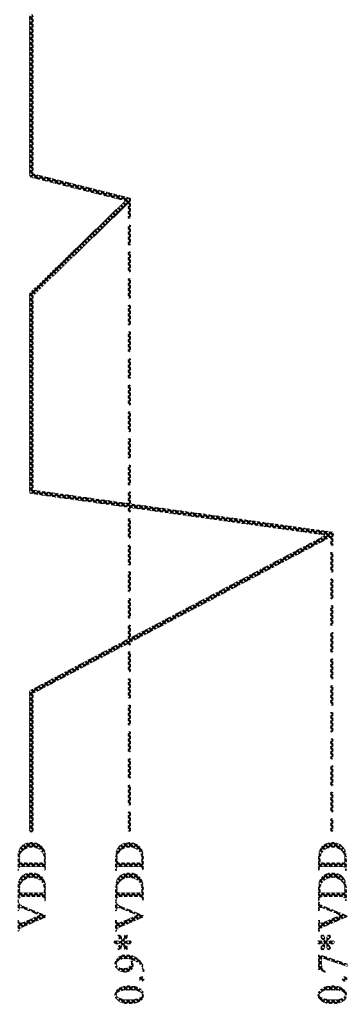
FIG. 4 is a diagram of a waveform of work voltage according to an embodiment of the invention.
Figure 5:
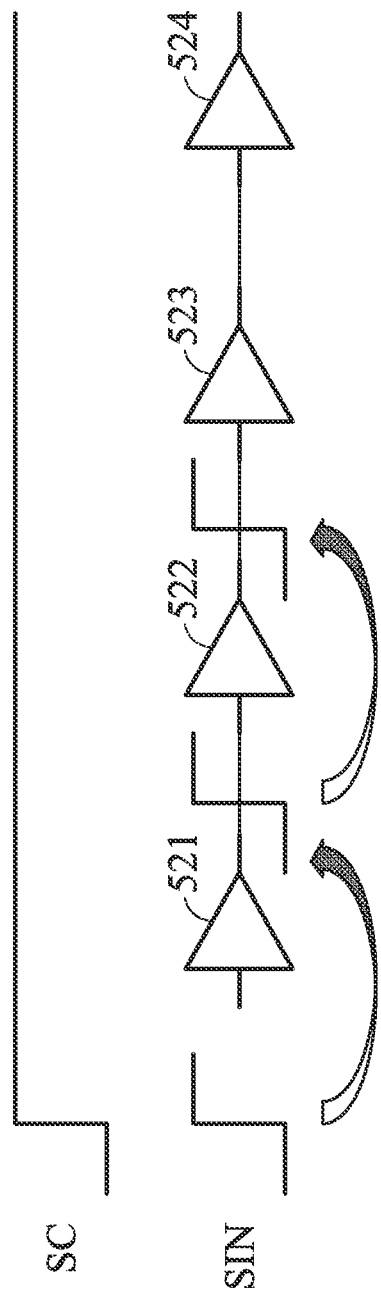
FIG. 5 is a diagram of a sensing circuit operating in a calculating mode according to an embodiment of the invention.
Figure 6:
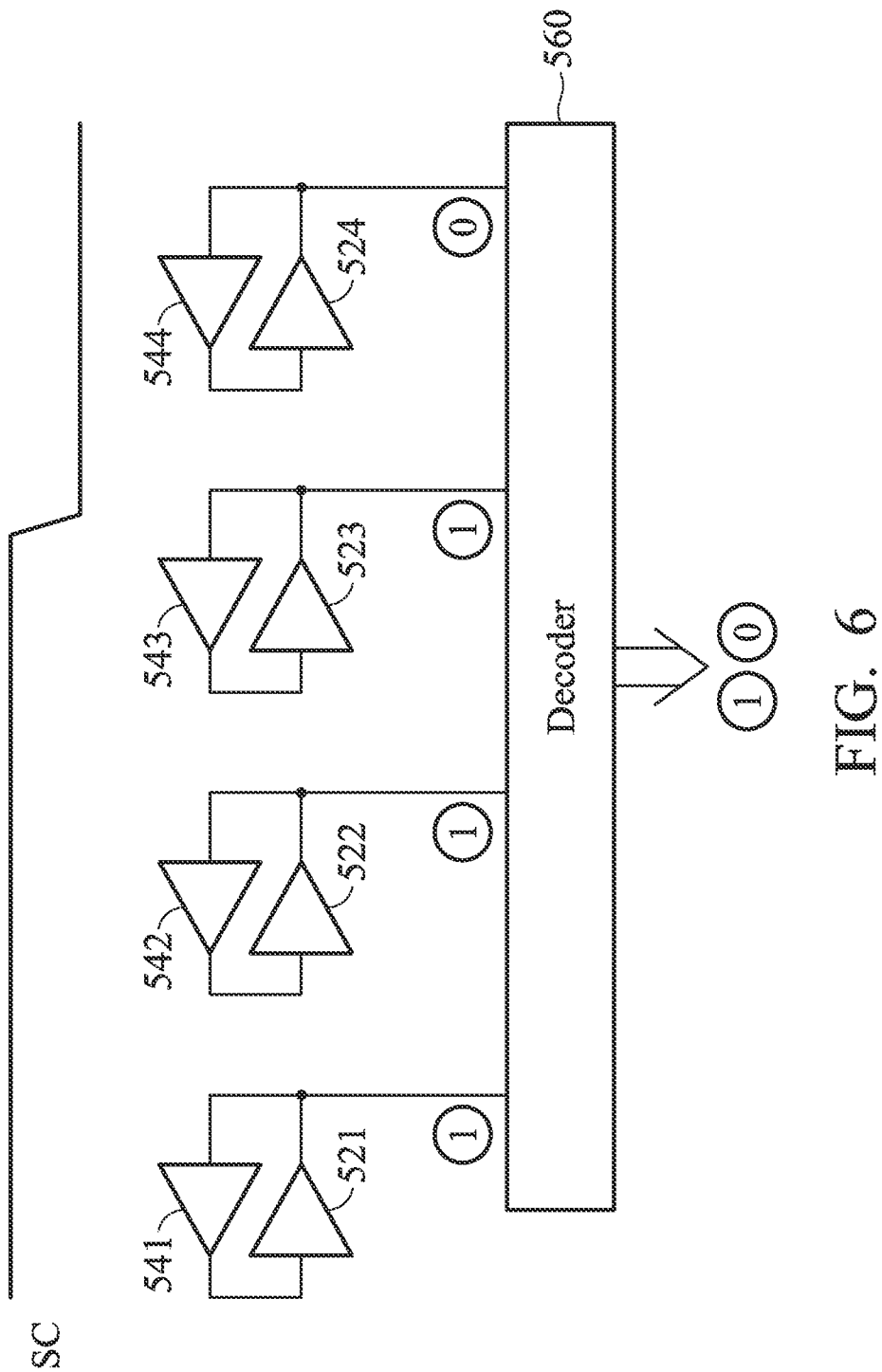
FIG. 6 is a diagram of a sensing circuit operating in a reading mode according to an embodiment of the invention.

FIG. 4 is a diagram of a waveform of the work voltage VDD according to an embodiment of the invention. In the embodiment of FIG. 4, if the work voltage VDD is not ideal, it may be affected by an IR drop, which results from the current and the resistance of the non-ideal power mesh. For example, the work voltage VDD may not be a fixed value, and may have some fluctuation intervals (e.g., the 0.9*VDD interval and the 0.7*VDD interval, which are lower than the original work voltage VDD). The fluctuation of the work voltage VDD may be considered as the so-called supply voltage noise, which degrades the performance of the system. To solve the problem, each of the aforementioned sensing circuits 100, 200, and 300 is added and configured to monitor and detect the supply voltage noise. The following embodiments of FIG. 5 and FIG. 6 are used for the reader to easily understand the theory and operation of the proposed sensing circuits 100, 200, and 300. Although the sensing circuits 100, 200, and 300 have slightly different structures, their design and operations are almost identical to each other.

FIG. 5 is a diagram of the sensing circuit 300 operating in the calculating mode according to an embodiment of the invention. Before the calculating mode, the reset signal SR with a low logic level may be applied to the sensing circuit 300 in the initial mode, such that all of the first delay signal SD1, the second delay signal SD2, the third delay signal SD3, and the fourth delay signal SD4 may be reset to a low logic level. The initial mode may be performed periodically before the calculating mode. Please refer to FIG. 3 and FIG. 5 together. As shown in FIG. 3 and FIG. 5, when the sensing circuit 300 enters the calculating mode, both the input signal SIN and the control signal SC rise from a low logic level to a high logic level. The first cascading switch 331, the second cascading switch 332, the third cascading switch 333, and the fourth cascading switch 334 are all closed, and the first delay unit 321, the second delay unit 322, the third delay unit 323, and the fourth delay unit 324 are coupled with each other, so as to form a progressing chain (In FIG. 5, the first delay unit 321, the second delay unit 322, the third delay unit 323, and the fourth delay unit 324 are modeled as four buffers 521 to 524). The input signal SIN, with a step waveform, is transmitted from the first delay unit 321 through the second delay unit 322 and the third delay unit 323 to the fourth delay unit 324.

FIG. 6 is a diagram of the sensing circuit 300 operating in the reading mode according to an embodiment of the invention. Please refer to FIG. 3 and FIG. 6 together. As shown in FIG. 3 and FIG. 6, when the sensing circuit 300 enters the reading mode, the control signal SC falls from a high logic level to a low logic level. The first cascading switch 331, the second cascading switch 332, the third cascading switch 333, and the fourth cascading switch 334 are all opened, and the first delay unit 321, the second delay unit 322, the third delay unit 323, and the fourth delay unit 324 are decoupled from each other, so as to form four independent latches for storing the first delay signal SD1, the second delay signal SD2, the third delay signal SD3, and the fourth delay signal SD4, respectively (In FIG. 6, the first delay unit 321, the second delay unit 322, the third delay unit 323, and the fourth delay unit 324 are modeled as four buffers 521 to 524, and the first feedback switch 341, the second feedback switch 342, the third feedback switch 343, and the fourth feedback switch 344 are modeled as other four buffers 541 to 544, such that fourth independent latches are formed by these buffers). Then, the first delay signal SD1, the second delay signal SD2, the third delay signal SD3, and the fourth delay signal SD4 stored in the aforementioned four latches are readable by a decoder 560.

Generally speaking, if the work voltage VDD is relatively high, the charging and discharging current of each delay unit will be relatively large, and the input signal SIN, with a step waveform, is transmitted faster in the delay chain; conversely, if the work voltage VDD is relatively low, the charging and discharging current of each delay unit will be relatively small, and the input signal SIN is transmitted slower in the delay chain. The transmission speed of the input signal SIN in the delay chain is substantially proportional to the average of the work voltage VDD. For example, if the delay signals of delay units show the bit combination "1111" (i.e., the first delay signal SD1, the second delay signal SD2, the third delay signal SD3, and the fourth delay signal SD4 each has a high logic level), it may represent that the transmission speed is normal and the work voltage VDD has no IR drop. Alternatively, if the delay signals of delay units show the bit combination "1110" (i.e., the first delay signal SD1, the second delay signal SD2, and the third delay signal SD3 each has a high logic level, and the fourth delay signal SD4 has a low logic level), it may represent that the transmission speed is relatively slow and the work voltage VDD has some IR drop and voltage noise, such that the progressing time of the input signal SIN is increased (as shown in FIG. 6). The decoder 560 is configured to convert the first delay signal SD1, the second delay signal SD2, the third delay signal SD3, and the fourth delay signal SD4 into the output single SOUT. For example, the decoder 560 can convert $2^N$ bits into N bits, so as to simply the output information, where N is a positive integer. For example, the bit combination "1111" of the delay signals SD1 to SD4 may be converted into a binary number "11" of the output signal SOUT, and alternatively, the bit combination "1100" of the delay signals SD1 to SD4 may be converted into a binary number "01" of the output signal SOUT. In such a case, the decoder 560 is configured to convert $2^2$ (4) bits of delay signals into 2 bits of output signal, where N is set to 2. Accordingly, if the output signal SOUT shows more high logic bits of the delay signals SD1 to SD4 and the input signal SIN is transmitted through more of the delay units, it may represent that the noise of the work voltage VDD is less serious. Conversely, if the output signal SOUT shows more low logic bits of the delay signals SD1 to SD4 and the input signal SIN is transmitted through less of the delay units, it may represent that the noise of the work voltage VDD is more serious. In the invention, the supply voltage noise may be detected and determined by analyzing the output signal SOUT. This analyzing procedure may be performed by other components, such as a processor (not shown).

The invention provides a novel sensing circuit for detecting supply voltage noise. By using a delay chain and transmitting an input signal thereon, the average magnitude of supply voltage for the delay chain can be estimated precisely. With such a design, if there is any noise or change in the supply voltage, it can be immediately detected by analyzing delay signals from the delay chain and the output signal from a decoder. In some embodiments, the invention may use a further two or more sensing circuits for sampling the supply voltage information in different time intervals one after another. In comparison to conventional designs, the proposed sensing circuit has at least the advantages of higher operating speeds, lower component costs, and a higher accuracy in voltage noise detection.

The above parameters are just exemplary, rather than limitations of the invention. One of ordinary skill may adjust these settings according to different requirements. It should be understood that the proposed sensing circuit is not limited to the configurations of FIGS. 1 to 6. The invention may merely include any one or more features of any one or more embodiments of FIGS. 1 to 6. In other words, not all of the features shown in the figures should be implemented in the sensing circuit of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A sensing circuit, comprising:
a delay chain, comprising:
a first delay unit, generating a first delay signal according to an input signal and a reset signal;
a first cascading switch, selectively passing the first delay signal according to a control signal; and
a first feedback switch, selectively forming a feedback path of the first delay unit according to a second control signal, wherein the second control signal is the inverse of the control signal; and
a decoder, generating an output signal according to the first delay signal.

2. The sensing circuit as claimed in claim 1, wherein in a calculating mode, the first cascading switch is closed and the first feedback switch is opened, such that the input signal progresses in the delay chain, and wherein in a reading mode, the first cascading switch is opened and the first feedback switch is closed, such that the first delay unit forms a latch and the decoder reads the first delay signal from the delay chain.

3. The sensing circuit as claimed in claim 1, wherein the first delay unit has a first input terminal for receiving the input signal, a second input terminal for receiving the reset signal, and an output terminal for outputting the first delay signal.

4. The sensing circuit as claimed in claim 3, wherein the first cascading switch has a first terminal coupled to the output terminal of the first delay unit, and a second terminal for selectively outputting the first delay signal.

5. The sensing circuit as claimed in claim 4, wherein the first feedback switch has a first terminal coupled to the output terminal of the first delay unit, and a second terminal coupled to the first input terminal of the first delay unit.

6. The sensing circuit as claimed in claim 2, wherein the first delay unit is implemented with an AND gate.

7. The sensing circuit as claimed in claim 6, wherein in an initial mode, the reset signal has a low logic level, and the first delay signal is kept at a low logic level, and wherein in other modes, the reset signal has a high logic level, and the first delay signal is adjustable.

8. The sensing circuit as claimed in claim 6, wherein when the sensing circuit enters the calculating mode, both the input signal and the control signal rise from a low logic level to a high logic level, and wherein when the sensing circuit enters the reading mode, the control signal falls from the high logic level to the low logic level.

9. The sensing circuit as claimed in claim 1, wherein the first cascading switch and the first feedback switch are complementary to each other and are implemented with transmission gates, and wherein each of the transmission gates comprises a PMOS transistor (P-type Metal Oxide Semiconductor Field Effect Transistor) and an NMOS transistor (N-type Metal Oxide Semiconductor Field Effect Transistor) coupled in parallel.

10. The sensing circuit as claimed in claim 1, wherein the delay chain further comprises:
 a second delay unit, generating a second delay signal according to the first delay signal and the reset signal;
 a second cascading switch, selectively passing the second delay signal according to the control signal; and
 a second feedback switch, selectively forming a feedback path of the second delay unit according to the control signal;
 wherein the output signal is generated by the decoder further according to the second delay signal.

11. The sensing circuit as claimed in claim 10, wherein in a calculating mode, the second cascading switch is closed and the second feedback switch is opened, such that the first delay signal progresses in the delay chain, and wherein in a reading mode, the second cascading switch is opened and the second feedback switch is closed, such that the second delay unit forms a latch and the decoder reads the second delay signal from the delay chain.

12. The sensing circuit as claimed in claim 10, wherein the second delay unit has a first input terminal for receiving the first delay signal, a second input terminal for receiving the reset signal, and an output terminal for outputting the second delay signal.

13. The sensing circuit as claimed in claim 12, wherein the second cascading switch has a first terminal coupled to the output terminal of the second delay unit, and a second terminal for selectively outputting the second delay signal.

14. The sensing circuit as claimed in claim 13, wherein the second feedback switch has a first terminal coupled to the output terminal of the second delay unit, and a second terminal coupled to the first input terminal of the second delay unit.

15. The sensing circuit as claimed in claim 10, wherein the second delay unit is implemented with an AND gate.

16. The sensing circuit as claimed in claim 10, wherein the second cascading switch and the second feedback switch are complementary to each other.

17. The sensing circuit as claimed in claim 10, wherein the delay chain further comprises:
 a third delay unit, generating a third delay signal according to the second delay signal and the reset signal;
 a third cascading switch, selectively passing the third delay signal according to the control signal;
 a third feedback switch, selectively forming a feedback path of the third delay unit according to the control signal;
 a fourth delay unit, generating a fourth delay signal according to the third delay signal and the reset signal;
 a fourth cascading switch, selectively passing the fourth delay signal according to the control signal; and
 a fourth feedback switch, selectively forming a feedback path of the fourth delay unit according to the control signal;
 wherein the output signal is generated by the decoder further according to the third delay signal and the fourth delay signal.

18. The sensing circuit as claimed in claim 17, wherein the first delay unit, the second delay unit, the third delay unit, and the fourth delay unit are supplied by a work voltage, and wherein if the work voltage has noise, the noise is detectable by analyzing the output signal of the decoder.

19. The sensing circuit as claimed in claim 17, wherein if the output signal shows that the input signal is transmitted through more of the first delay unit, the second delay unit, the third delay unit, and the fourth delay unit, it represents that the noise of the work voltage is less serious.

20. The sensing circuit as claimed in claim 1, wherein the decoder is arranged for converting $2^N$ bits into N bits, and wherein N is a positive integer.

* * * * *